(12) United States Patent
Liao et al.

(10) Patent No.: US 11,901,457 B2
(45) Date of Patent: Feb. 13, 2024

(54) FIN SHAPING AND INTEGRATED CIRCUIT STRUCTURES RESULTING THEREFROM

(71) Applicant: Intel Corporation, Santa Clara, CA (US)

(72) Inventors: Szuya S. Liao, Portland, OR (US); Rahul Pandey, Hillsboro, OR (US); Rishabh Mehandru, Portland, OR (US); Anupama Bowonder, Portland, OR (US); Pratik Patel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 895 days.

(21) Appl. No.: 16/700,431

(22) Filed: Dec. 2, 2019

(65) Prior Publication Data

US 2021/0167209 A1    Jun. 3, 2021

(51) Int. Cl.
| | | |
|---|---|---|
| *H01L 29/78* | (2006.01) |
| *H01L 29/08* | (2006.01) |
| *H01L 27/088* | (2006.01) |
| *H01L 29/66* | (2006.01) |

(52) U.S. Cl.
CPC ...... *H01L 29/7853* (2013.01); *H01L 27/0886* (2013.01); *H01L 29/0847* (2013.01); *H01L 29/66795* (2013.01)

(58) Field of Classification Search
CPC ..... H01L 21/823431; H01L 21/823821; H01L 21/845; H01L 27/0886; H01L 27/0924; H01L 27/1211; H01L 29/0847; H01L 29/41791; H01L 29/66795; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 10,109,742 B2 * | 10/2018 | Chao | H01L 29/66795 |
| 2016/0343710 A1 * | 11/2016 | Yu | H01L 29/785 |
| 2018/0247938 A1 * | 8/2018 | Cheng | H01L 21/823821 |
| 2019/0035934 A1 * | 1/2019 | Chung | H01L 29/7854 |
| 2019/0343710 A1 * | 11/2019 | Lerner | A61H 3/00 |
| 2020/0176584 A1 * | 6/2020 | Wu | H01L 29/0657 |

OTHER PUBLICATIONS

Office Action from U.S. Appl. No. 18/088,469, dated Apr. 19, 2023, 8 pgs.

* cited by examiner

*Primary Examiner* — David C Spalla
(74) *Attorney, Agent, or Firm* — Schwabe, Williamson & Wyatt, P.C.

(57) ABSTRACT

Fin shaping, and integrated circuit structures resulting therefrom, are described. For example, an integrated circuit structure includes a semiconductor fin having a protruding fin portion above an isolation structure above a substrate. The protruding fin portion has substantially vertical upper sidewalls and outwardly tapered lower sidewalls. A gate stack is over and conformal with the protruding fin portion of the semiconductor fin. A first source or drain region is at a first side of the gate stack, and a second source or drain region is at a second side of the gate stack opposite the first side of the gate stack.

23 Claims, 12 Drawing Sheets

FIN SHAPING AND INTEGRATED CIRCUIT STRUCTURES RESULTING THEREFROM

TECHNICAL FIELD

Embodiments of the disclosure are in the field of semiconductor devices and processing and, in particular, fin shaping, and integrated circuit structures resulting therefrom.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1:
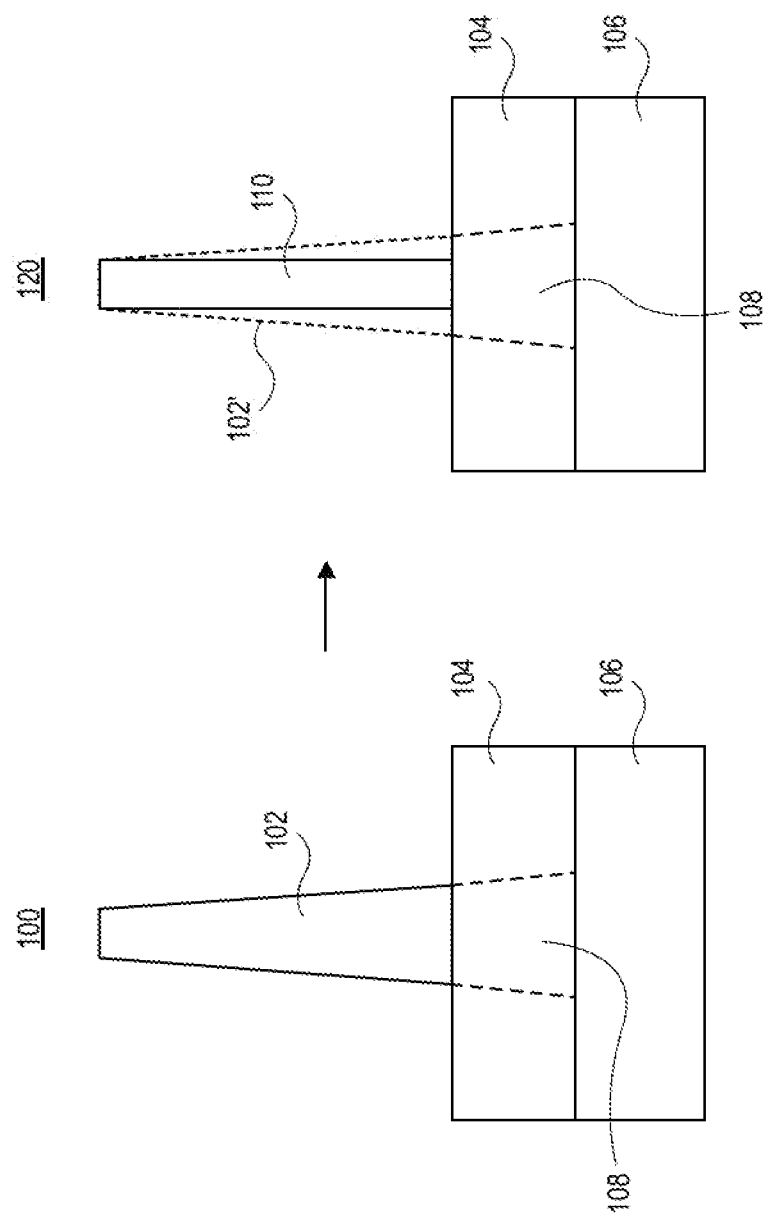
FIG. 1 illustrates cross-sectional views of various operations in a method of fabricating a semiconductor fin using a fin shaping approach, in accordance with an embodiment of the present disclosure.

Fin shaping, and integrated circuit structures resulting therefrom, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to approaches for fin scaling for enhanced strain retention for silicon and other channel semiconductor materials. Fin architectures described herein may be implemented to improve device performance.

To provide context, it is desirable to maintain mechanical stability of a transistor channel realized in a fin/wire/sheet geometry together with plentiful epitaxial volume (epi-volume) in source or drain regions to maximize strain transfer to the channel. Both mechanical stability and plentiful epi-volume, however, typically demand larger fin widths. On the contrary, thicker fins can degrade transistor performance at the sub-threshold through increased source-to-drain coupling. Such source-to-drain coupling can also exacerbate energy loss through increased (less desirable) leakage. State-of-the-art fin width optimization solutions to address the above issues have proven to degrade capacitance through loss of spacer dielectric and also decrease transistor yield, thereby proving essentially ineffective.

In accordance with an embodiment of the present disclosure, an active channel region of fin body is shaped selectively after the channel is exposed post isolation recess and before replacement metal gate to achieve effectively zero capacitance penalty. The end result is a shaped, highly scaled active fin in the active channel portion of the fin with a wider fin base in the portion of the fin not gated. Approaches described herein can be implemented to ensure retention of channel strain without loss of strain from buckling of tall fins scaled to dimension prior to isolation formation. Embodiments may be implemented to provide a structure having a thin fin body under a gate electrode but a thick fin body in an epi-region (e.g., in a source or drain region) to maximize channel strain without loss to spacer dielectric.

Embodiments described herein may be implemented to enable maximized channel strain at highly scaled fin dimensions, providing high electrical drive current with reduced supply voltage and power consumption. Embodiments described herein may be implemented to maintain fin mechanical stability at the same time with no cost to parasitic capacitance as well as external resistance for silicon and other semiconducting channel materials.

In an embodiment, approaches described herein can be applied to transistors in fin or wire (or ribbon) architectures formed by any semiconductor material or their combinations, such as silicon, $Si_{1-x}Ge_x$ (x=0.1 to 1), a group III-V compound semiconductor, etc. The fins or wires or nanoribbons can have any form of n-type or p-type well doping or be of an intrinsic nature. In an embodiment, approaches described herein can be implemented to maintain fin mechanical strength and prevent extra capacitance penalty caused by shaping the fin. In an embodiment, approaches described herein can be implemented to reduce sub-threshold transistor leakages and improve gate control over a channel. In an embodiment, approaches described herein can be implemented to provide a same scaled active fin dimension as shaping the fin during fin formation without buckling, fin collapse and or strain loss concerns. In an embodiment, approaches described herein can be implemented to pattern different device types selectively, an example of which is described below in association with FIG. 5. Such an approach can be very useful to address technology requirements based on different device polarity, i.e., N-type or P-type. In an embodiment, approaches described herein can be implemented to tune threshold voltage of a certain specific set of transistors. In an embodiment, approaches described herein can be implemented to target devices across different power-performance specifications, such as low-power and low-leakage, standard performance and nominal VT, high performance and low VT devices, SRAM and logic transistors.

As exemplary implementations of embodiments described herein, cross-sectional views of a fin cut under a gate location are illustrated and described in association with FIGS. 1, 2 and 3 below. A fin-shaping approach may target a fin shape to achieve a more vertical taper (e.g., FIG. 1), or a selective shaping near a fin bottom may be performed (e.g., FIGS. 2 and 3). In an embodiment, a fin portion a under a source or drain is not shaped, as described in association with FIG. 4.

As an example of a fin shaping approach used to provide a more vertical taper (i.e., non-taper), FIG. 1 illustrates cross-sectional views of various operations in a method of fabricating a semiconductor fin using a fin shaping approach, in accordance with an embodiment of the present disclosure.

Referring to structure 100 of FIG. 1, a fin 102 is shown as initially formed, i.e., without an additional fin shaping implementation. The fin 102 is formed above a substrate 106, such as a silicon substrate. The reference to 104 in FIG. 1 can be an isolation structure such as a shallow trench isolation structure in which a sub-fin portion 108 couples the fin 102 and the substrate 106. Alternatively, the reference to 104 in FIG. 1 can be to a semiconductor layer different than the fin 102 in which case a sub-fin portion 108 is not present.

Referring again to FIG. 1, structure 120 represents structure 100 following a fin shaping process. The dashed lines 102' indicate the starting shape of fin 102. Structure 120 includes a semiconductor fin having a protruding fin portion 110 above a substrate 106. The protruding fin portion 110 has substantially vertical upper sidewalls and substantially vertical lower sidewalls, i.e., has sidewalls that are essentially continuously vertical.

In an embodiment, 104 is an isolation structure 104 above the substrate 106, and the semiconductor fin further includes a sub-fin portion 108 on the substrate 106 and within an opening in the isolation structure 104. In one embodiment, the sub-fin portion 108 is continuous with the protruding portion 110, as is depicted. In one embodiment, the sub-fin portion 108 has a width greater than a width of the protruding portion 110 where the sub-fin portion 108 meets the protruding portion 110, as is depicted, to leave exposed upper horizontal surfaces of sub-fin portion 108. In one embodiment, the sub-fin portion 108 is essentially unchanged between structures 100 and 120.

In another embodiment, 104 is a semiconductor layer 104 on the substrate 106. In one embodiment, the semiconductor fin includes only the protruding fin portion 110 which is on the semiconductor layer 104, as is depicted in the case where the dashed lines of 108 are removed. In one embodiment, the semiconductor fin, i.e., the protruding fin portion 110, is composed of a semiconductor material different than the semiconductor layer 104.

In an embodiment, the substrate 106 is a monocrystalline silicon substrate, and the semiconductor fin (e.g., either protruding fin portion 110, or the combination of protruding fin portion 110 and sub-fin portion 108) is a silicon fin. In another embodiment, the substrate 106 is a monocrystalline silicon substrate, and the semiconductor fin (e.g., either protruding fin portion 110, or the combination of protruding fin portion 110 and sub-fin portion 108) is a silicon germanium or germanium fin. In yet another embodiment, the substrate 106 is a monocrystalline silicon substrate, and the semiconductor fin (e.g., either protruding fin portion 110, or the combination of protruding fin portion 110 and sub-fin portion 108) is a group III-V material fin.

Figure 2:
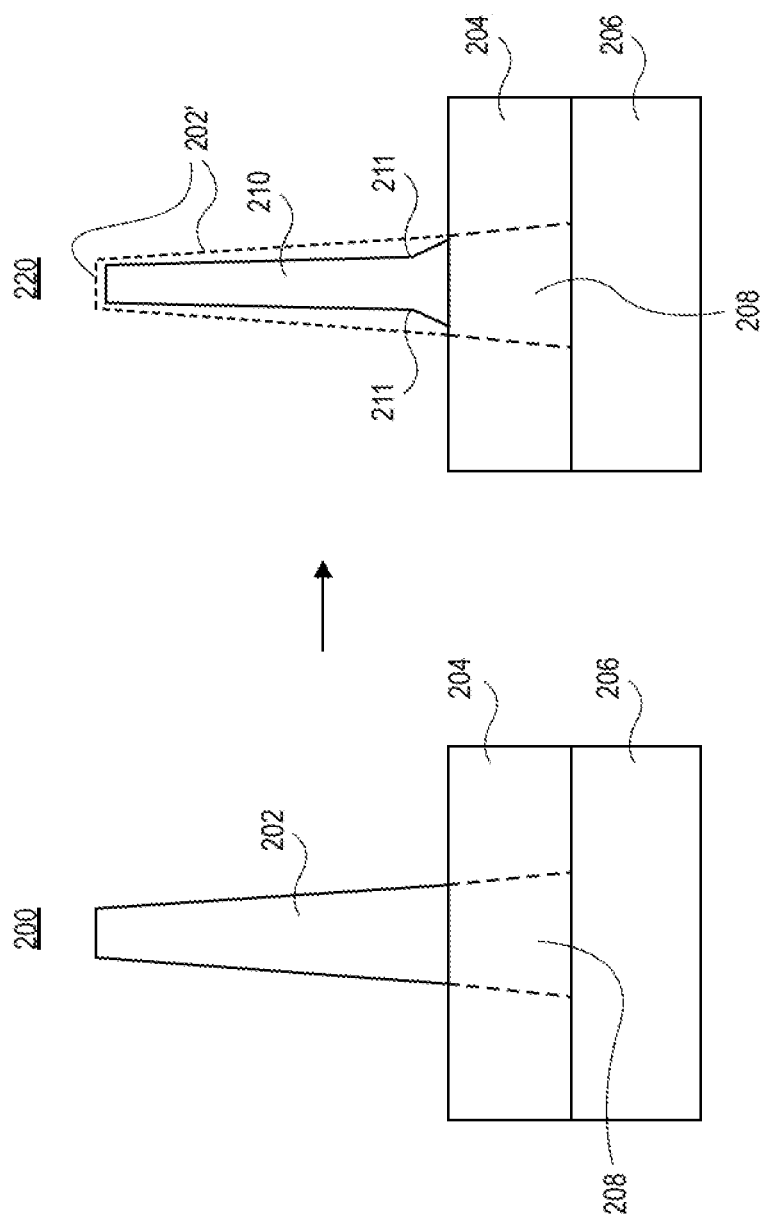
FIG. 2 illustrates cross-sectional views of various operations in a method of fabricating a semiconductor fin using another fin shaping approach, in accordance with an embodiment of the present disclosure.

As a first example of a fin shaping approach used to provide a lower fin feature, FIG. 2 illustrates cross-sectional views of various operations in a method of fabricating a semiconductor fin using another fin shaping approach, in accordance with an embodiment of the present disclosure.

Referring to structure 200 of FIG. 2, a fin 202 is shown as initially formed, i.e., without an additional fin shaping implementation. The fin 202 is formed above a substrate 206, such as a silicon substrate. The reference to 204 in FIG. 2 can be an isolation structure such as a shallow trench isolation structure in which a sub-fin portion 208 couples the fin 202 and the substrate 206. Alternatively, the reference to 204 in FIG. 2 can be to a semiconductor layer different than the fin 202 in which case a sub-fin portion 208 is not present.

Referring again to FIG. 2, structure 220 represents structure 200 following a fin shaping process. The dashed lines 202' indicate the starting shape of fin 202. Structure 220 includes a semiconductor fin having a protruding fin portion 210 above a substrate 206. The protruding fin portion 210 has substantially vertical upper sidewalls and outwardly tapered lower sidewalls that begin at location 211 of protruding fin portion 210.

In an embodiment, 204 is an isolation structure 204 above the substrate 206, and the semiconductor fin further includes a sub-fin portion 208 on the substrate 206 and within an opening in the isolation structure 204. In one embodiment, the sub-fin portion 208 is continuous with the protruding portion 210, as is depicted. In one embodiment, the sub-fin portion 208 has a width greater than a width of the protruding portion 210 where the sub-fin portion 208 meets the protruding portion 210, as is depicted, to leave exposed upper horizontal surfaces of sub-fin portion 208 albeit less so than structure 120 of FIG. 1. In one embodiment, the sub-fin portion 208 is essentially unchanged between structures 200 and 220.

In another embodiment, 204 is a semiconductor layer 204 on the substrate 206. In one embodiment, the semiconductor fin includes only the protruding fin portion 210 which is on the semiconductor layer 204, as is depicted in the case where the dashed lines of 208 are removed. In one embodiment, the semiconductor fin, i.e., the protruding fin portion 210, is composed of a semiconductor material different than the semiconductor layer 204.

In an embodiment, the substrate 206 is a monocrystalline silicon substrate, and the semiconductor fin (e.g., either protruding fin portion 210, or the combination of protruding fin portion 210 and sub-fin portion 208) is a silicon fin. In another embodiment, the substrate 206 is a monocrystalline silicon substrate, and the semiconductor fin (e.g., either protruding fin portion 210, or the combination of protruding fin portion 210 and sub-fin portion 208) is a silicon germanium or germanium fin. In yet another embodiment, the substrate 206 is a monocrystalline silicon substrate, and the semiconductor fin (e.g., either protruding fin portion 210, or the combination of protruding fin portion 210 and sub-fin portion 208) is a group III-V material fin.

Figure 3:
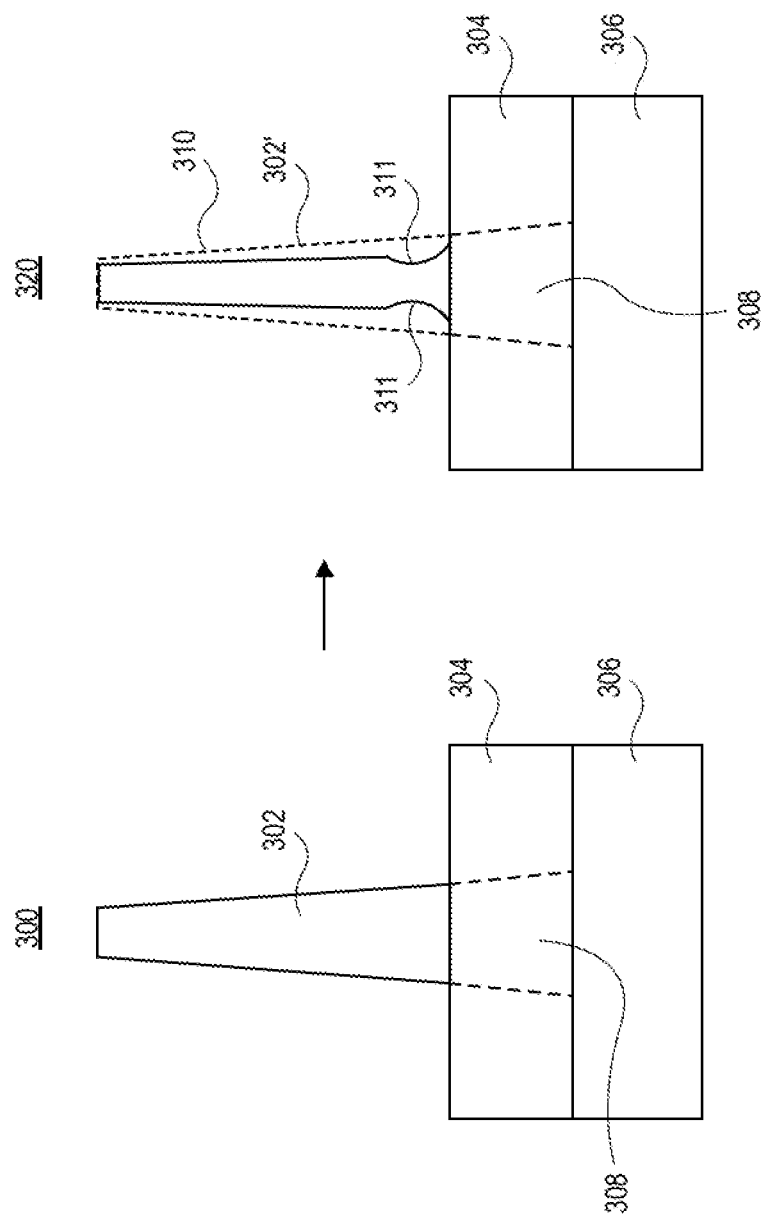
FIG. 3 illustrates cross-sectional views of various operations in a method of fabricating a semiconductor fin using yet another fin shaping approach, in accordance with an embodiment of the present disclosure.

As a second example of a fin shaping approach used to provide a lower fin feature, FIG. 3 illustrates cross-sectional views of various operations in a method of fabricating a semiconductor fin using yet another fin shaping approach, in accordance with an embodiment of the present disclosure.

Referring to structure 300 of FIG. 3, a fin 302 is shown as initially formed, i.e., without an additional fin shaping implementation. The fin 302 is formed above a substrate 306, such as a silicon substrate. The reference to 304 in FIG. 3 can be an isolation structure such as a shallow trench isolation structure in which a sub-fin portion 308 couples the fin 302 and the substrate 306. Alternatively, the reference to 304 in FIG. 3 can be to a semiconductor layer different than the fin 302 in which case a sub-fin portion 308 is not present.

Referring again to FIG. 3, structure 320 represents structure 300 following a fin shaping process. The dashed lines 302' indicate the starting shape of fin 302. Structure 320 includes a semiconductor fin having a protruding fin portion 310 above a substrate 306. The protruding fin portion 310 has substantially vertical upper sidewalls and inwardly tapered lower sidewalls to provide notch features 311 of protruding fin portion 310.

In an embodiment, 304 is an isolation structure 304 above the substrate 306, and the semiconductor fin further includes a sub-fin portion 308 on the substrate 306 and within an opening in the isolation structure 304. In one embodiment, the sub-fin portion 308 is continuous with the protruding fin portion 310, as is depicted. In one embodiment, the sub-fin portion 308 has a width greater than a width of the protruding fin portion 310 where the sub-fin portion 308 meets the protruding fin portion 310, as is depicted, to leave exposed upper horizontal surfaces of sub-fin portion 308. In one embodiment, the sub-fin portion 308 is essentially unchanged between structures 300 and 320.

In another embodiment, 304 is a semiconductor layer 304 on the substrate 306. In one embodiment, the semiconductor fin includes only the protruding fin portion 310 which is on the semiconductor layer 304, as is depicted in the case where the dashed lines of 308 are removed. In one embodiment, the semiconductor fin, i.e., the protruding fin portion 310, is composed of a semiconductor material different than the semiconductor layer 304.

In an embodiment, the substrate 306 is a monocrystalline silicon substrate, and the semiconductor fin (e.g., either protruding fin portion 310, or the combination of protruding fin portion 310 and sub-fin portion 308) is a silicon fin. In another embodiment, the substrate 306 is a monocrystalline silicon substrate, and the semiconductor fin (e.g., either protruding fin portion 310, or the combination of protruding fin portion 310 and sub-fin portion 308) is a silicon germanium or germanium fin. In yet another embodiment, the substrate 306 is a monocrystalline silicon substrate, and the semiconductor fin (e.g., either protruding fin portion 310, or the combination of protruding fin portion 310 and sub-fin portion 308) is a group III-V material fin.

It is to be appreciated that the above described fin shaping approaches may be performed using an etch process. In one embodiment, dry etch or plasma etch process is used. In one embodiment, a wet etch process is used. In one embodiment, a combination of a dry etch or plasma etch process and a wet etch process is used.

It is to be appreciated that, in accordance with an embodiment of the present disclosure, and as described below in greater detail in association with FIGS. 6A and 6B, a gate stack can be formed over and conformal with the protruding fin portions 110, 210 or 310 of the above described semiconductor fins. In one embodiment, an initial sacrificial gate electrode structure is removed from the channel region of a semiconductor fin, the channel region is subjected to a fin shaping process, and then a permanent gate stack is formed over the shaped portion (channel region) of the fin. In other embodiments, the fin shaping is performed prior to a replacement gate process. In either case, in an embodiment, a permanent gate stack ultimately formed over and conformal with the protruding fin portions 110, 210 or 310 of the above described semiconductor fins includes a gate dielectric including a high-k dielectric material, and a gate electrode including a metal.

It is to be appreciated that, in accordance with an embodiment of the present disclosure, and as described below in greater detail in association with FIGS. 4, 6A and 6B, source or drain structures may be formed on either side of the channel region of the above described fins, e.g., on either side of the shaped protruding fin portions 110, 210 or 310 of the above described semiconductor fins. In an embodiment, a first source or drain region is at a first side of a gate stack, and a second source or drain region is at a second side of the gate stack opposite the first side of the gate stack. In one embodiment, the first and second source or drain regions are embedded source or drain regions. In another embodiment, the first and second source or drain regions are formed in regions of the semiconductor fin at the first and second sides of the gate stack, respectively.

In some embodiments, only the channel region (e.g., and not the source or drain regions) of a protruding fin portion is shaped according to an above shaping approach. In other embodiments, an entire protruding portion (e.g., the channel region and the source or drain regions) is shaped according to an above shaping approach. As an example, of the formed approach, which may enable a healthy epi-volume and preserve maximum strain in the channel to yield high electrical drive current, FIG. 4 illustrates cross-sectional view of a source or drain region of an integrated circuit structure, in accordance with an embodiment of the present disclosure.

Figure 4:
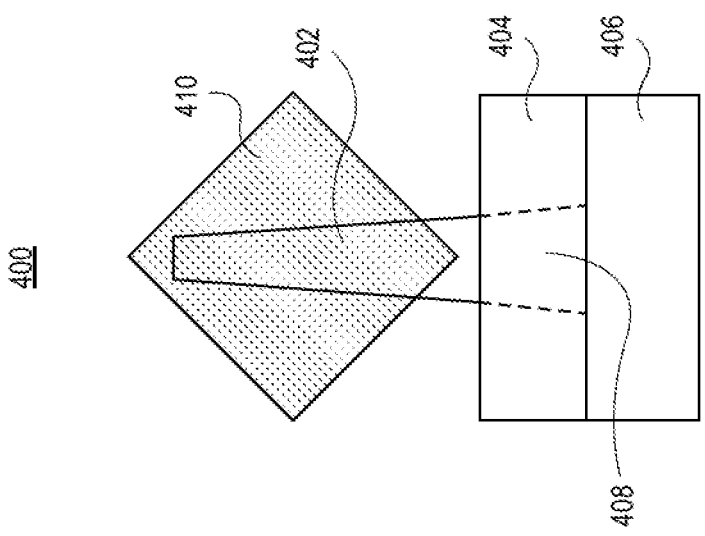
FIG. 4 illustrates cross-sectional view of a source or drain region of an integrated circuit structure, in accordance with an embodiment of the present disclosure.

Referring to FIG. 4, a structure 400 is shown at a source or drain location and includes a fin 402 which has not been subjected to an additional fin shaping implementation. The fin 402 is formed above a substrate 406, such as a silicon substrate. The reference to 404 in FIG. 4 can be an isolation structure such as a shallow trench isolation structure in which a sub-fin portion 408 couples the fin 402 and the substrate 406. Alternatively, the reference to 404 in FIG. 4 can be to a semiconductor layer different than the fin 402 in which case a sub-fin portion 408 is not present. In either case, an epitaxial structure 410 (which may be a material suitable to induce strain on a channel region) may be grown onto the fin 402 or embedded in the fin 402 at the source or drain location. For convenience of illustration, epitaxial structure 410 is depicted overlying fin 402 in order to represent both possibilities. In the formed case, epitaxial growth occurs on the top and sidewalls of the fin 402. In the latter case, a portion of the fin 402 is removed prior to growth of epitaxial structure 410. It is to be appreciated that, for a device, the structure 400 may be adjacent a channel region that has been shaped, e.g., adjacent to shaped protruding fin portions 110, 210 or 310.

In another aspect, a fin shaping approach is used in a channel region of one device or device type but not for the channel region of another device or device type. That is, one of the above described fin-shaping approaches can be applied selectively to individual device types. As an example, FIG. 5 illustrates a cross-sectional view of an integrated circuit structure including a first structure having a standard fin and a second structure having a fin fabricated using a fin shaping approach, in accordance with an embodiment of the present disclosure.

Figure 5:
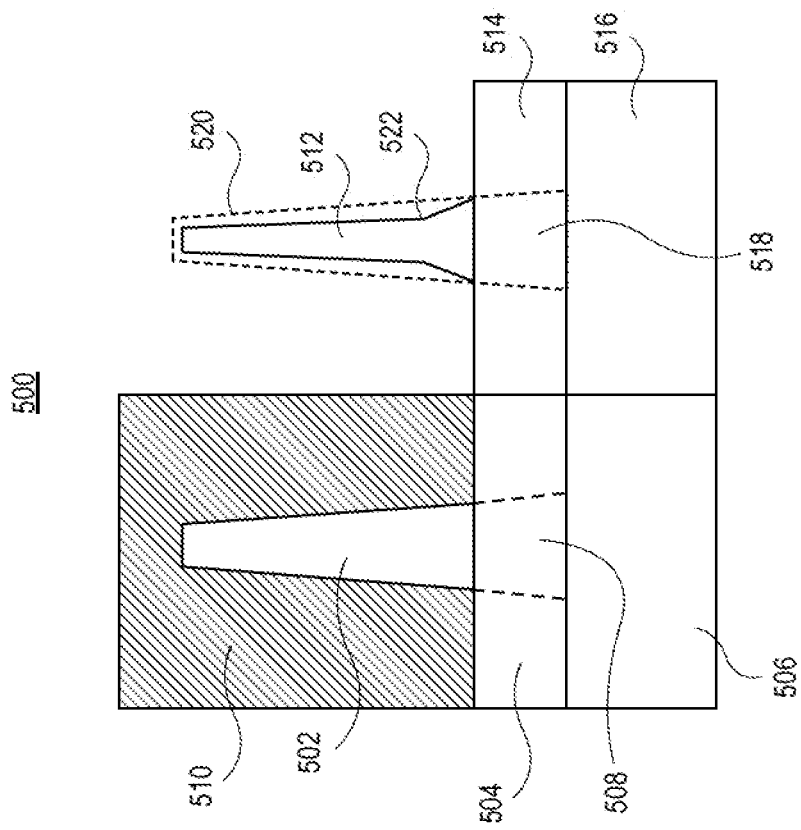
FIG. 5 illustrates cross-sectional view of an integrated circuit structure including a first structure having a standard fin and a second structure having a fin fabricated using a fin shaping approach, in accordance with an embodiment of the present disclosure.

Referring to FIG. 5, as shown mid-processing, an intermediate structure 500 includes a masked device location on the left-hand side including a fin 502 without an additional fin shaping implementation. The fin 502 is formed above a first substrate region 506, such as a first region of a silicon substrate. The reference to 504 in FIG. 5 can be an isolation structure such as a shallow trench isolation structure in which a sub-fin portion 508 couples the fin 502 and the first substrate region 506. Alternatively, the reference to 504 in FIG. 5 can be to a semiconductor layer different than the fin 502 in which case a sub-fin portion 508 is not present. The masked device location on the left-hand side includes a temporary mask 510 thereon which is present during a fin shaping operation employed for other devices, effectively blocking the masked device location on the left-hand side from being subjected to a fin shaping operation.

Referring again to FIG. 5, the intermediate structure 500 includes a non-masked device location on the right-hand side which is subjected to a fin shaping process. The dashed lines 520 indicate the starting shape of the fin. The non-masked device location on the right-hand side includes a semiconductor fin having a protruding fin portion 512 above a second substrate region 516 which is included in a same substrate as first substrate region 506. In the particular embodiment shown, the protruding fin portion 512 has substantially vertical upper sidewalls and outwardly tapered lower sidewalls that begin at location 522 of protruding fin portion 512, e.g., such as the example of FIG. 2. In other embodiments, a structure such as described in association with FIG. 1 or FIG. 3 is formed.

In an embodiment, 514 is an isolation structure 514 above the second substrate region 516, and the semiconductor fin further includes a sub-fin portion 518 on the second substrate region 516 and within an opening in the isolation structure 514. In one embodiment, the sub-fin portion 518 is continuous with the protruding fin portion 512, as is depicted. In another embodiment, 514 is a semiconductor layer 514 on the second substrate region 516. In one embodiment, the semiconductor fin includes only the protruding fin portion 512 which is on the semiconductor layer 514, as is depicted in the case where the dashed lines of 518 are removed. In one such embodiment, the semiconductor fin, i.e., the protruding fin portion 512, is composed of a semiconductor material different than the semiconductor layer 514.

More generally, embodiments described herein may enable the fabrication of device structures that include new channel architectures for field effect transistors (FETs) such as finFETs, trigate FETs, or nanowire FETs. One or more embodiments include devices using such channel architectures to provide reduced external resistance (Rext) and capacitance as otherwise observed for conventional finFET devices. Furthermore, improved short channel effects (e.g., reduced leakage) are achieved as otherwise observed for conventional finFET devices. One or more embodiments may be applicable for high performance, low leakage logic complementary metal oxide semiconductor (CMOS) devices. More specifically, one or more embodiments described herein are directed to approaches for forming silicon (Si)-containing non-planar architectures, although other semiconductor materials may be used in place of or together with silicon. In an embodiment one or more devices described herein may be characterized as a fin-based device, a nanoribbon-based device, a nanowire-based device, a non-planar transistor, an omega-FET, a trigate-based device, a multi-gate device, or a combination thereof.

It is to be appreciated that the structures resulting from the above exemplary processing schemes, e.g., structures from one or more of FIGS. 1-5, may be used in a same or similar form for subsequent processing operations to complete device fabrication, such as PMOS and NMOS device fabrication. As an example of a completed device, FIGS. 6A and 6B illustrate a cross-sectional view and a plan view (taken along the a-a' axis of the cross-sectional view), respectively, of a non-planar integrated circuit structure, in accordance with an embodiment of the present disclosure.

Figure 6A:
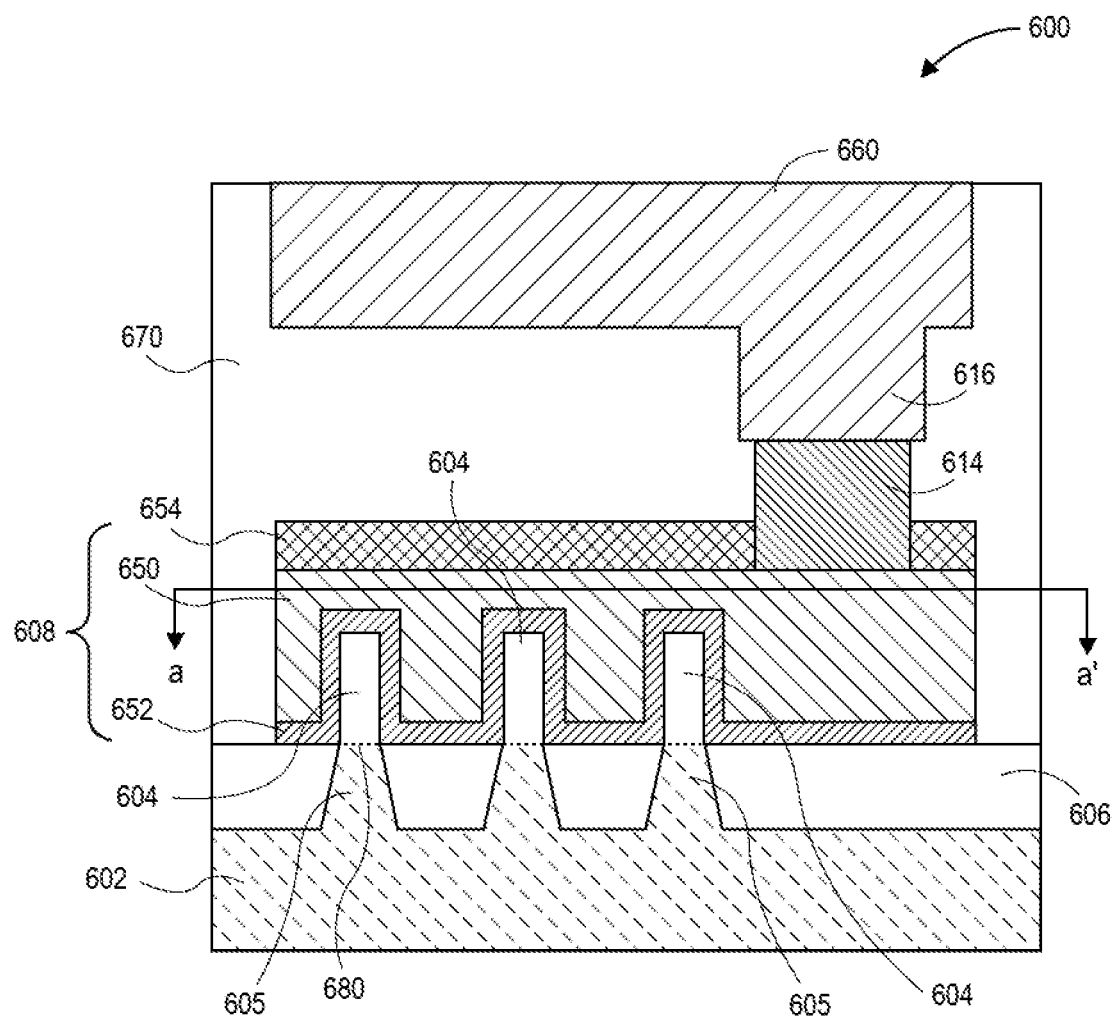
FIG. 6A illustrates a cross-sectional view of a non-planar integrated circuit structure, in accordance with an embodiment of the present disclosure.
Figure 6B:
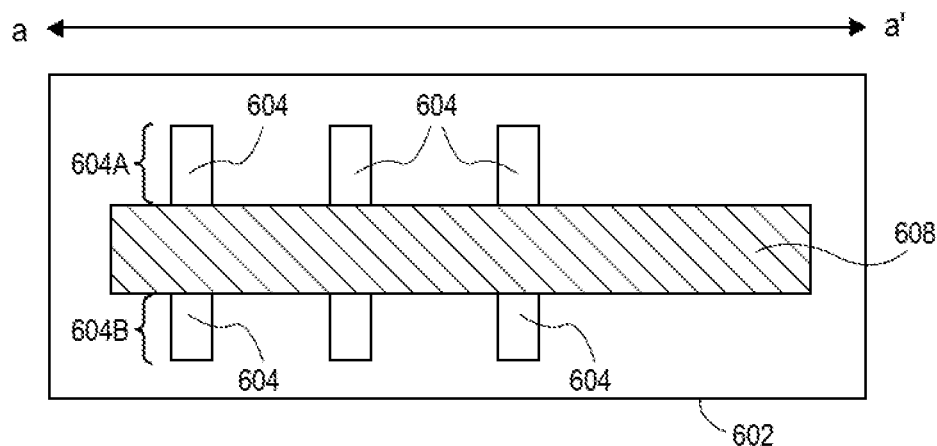
FIG. 6B illustrates a plan view taken along the a-a' axis of the non-planar integrated circuit structure of FIG. 6A, in accordance with an embodiment of the present disclosure.

Referring to FIGS. 6A and 6B, a semiconductor structure or device 600 includes a non-planar active region (e.g., a fin structure including protruding fin portion 604 and sub-fin region 605) formed on substrate 602, and within isolation region 606. A plurality of such fins may be referred to as a grating structure of semiconductor fins. A gate line 608 is over the protruding fin portions 604 of the non-planar active region as well as over a portion of the isolation region 606.

In accordance with one or more embodiments described herein, each protruding fin portion 604 has substantially vertical sidewalls, as is depicted. In one such embodiment, although not depicted, the sub-fin region 605 has a width greater than a width of the protruding fin portion 604 where the sub-fin region 605 meets the protruding fin portion 604, as illustrated in and described in association with FIG. 1. In another embodiment, although not depicted, the protruding fin portion 604 has substantially vertical upper sidewalls and outwardly tapered lower sidewalls, as illustrated in and described in association with FIG. 2. In yet another embodiment, although not depicted, the protruding fin portion 604 has substantially vertical upper sidewalls and inwardly tapered lower sidewalls, as illustrated in and described in association with FIG. 3.

As shown, gate line 608 includes a gate electrode 650 and a gate dielectric layer 652. In one embodiment, gate line 608 may also include a dielectric cap layer 654. A gate contact 614, and overlying gate contact via 616 are also seen from this perspective, along with an overlying metal interconnect 660, all of which are in interlayer dielectric stacks or layers 670, such as low-k dielectric materials. Also seen from the perspective of FIG. 6A, the gate contact 614 is, in one embodiment, over isolation region 606, but not over the non-planar active regions. Alternatively, in another embodiment, the gate contact 614 is over one or more of the non-planar active regions to provide a contact over active gate layout.

As is also depicted in FIG. 6A, in an embodiment, an interface 680 exists between a protruding fin portion 604 and sub-fin region 605. The interface 680 can be a transition region between a doped sub-fin region 605 and a lightly or undoped upper fin portion 604. In one such embodiment, each fin is approximately 10 nanometers wide or less, and sub-fin dopants are supplied from an adjacent solid state doping layer at the sub-fin location. It is to be appreciated that the lightly or undoped upper fin portion 604 is characterized as such with respect to N-type or P-type dopants.

Referring to FIG. 6B, the gate line 608 is shown as over the protruding fin portions 604. Although not depicted, it is to be appreciated that a plurality of gate lines may be formed to provide a grating of gate lines. Source and drain regions 604A and 604B of the protruding fin portions 604 can be seen from this perspective. In one embodiment, the source and drain regions 604A and 604B are doped portions of original material of the protruding fin portions 604. In another embodiment, the material of the protruding fin portions 604 is removed and replaced with the same or a different semiconductor material as the protruding fin portions, e.g., by epitaxial deposition to form embedded source and drain regions. In either case, the source and drain regions 604A and 604B may extend below the height of dielectric layer 606, i.e., into the sub-fin region 605. In accordance with an embodiment of the present disclosure, the more heavily doped sub-fin regions, i.e., the doped portions of the fins below interface 680, inhibits source to drain leakage through this portion of the bulk semiconductor fins.

In an embodiment, the semiconductor structure or device 600 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 608 surround at least a top surface and a pair of sidewalls of the three-dimensional body.

Substrate 602 may be composed of a semiconductor material that can withstand a manufacturing process and in which charge can migrate. In an embodiment, substrate 602 is a bulk substrate composed of a crystalline silicon, silicon/germanium or germanium layer doped with a charge carrier, such as but not limited to phosphorus, arsenic, boron or a combination thereof, to form active region 604. In one embodiment, the concentration of silicon atoms in bulk substrate 602 is greater than 97%. In another embodiment, bulk substrate 602 is composed of an epitaxial layer grown atop a distinct crystalline substrate, e.g. a silicon epitaxial layer grown atop a boron-doped bulk silicon mono-crystalline substrate. Bulk substrate 602 may alternatively be composed of a group III-V material. In an embodiment, bulk substrate 602 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 602 is composed of a group III-V material and the charge-carrier dopant impurity atoms are ones such as, but not limited to, carbon, silicon, germanium, oxygen, sulfur, selenium or tellurium.

In accordance with one or more embodiments of the present disclosure, the fin structure including protruding fin portion 604 and sub-fin region 605 has a same semiconductor composition as substrate 602. In a particular embodiment, the substrate 602 is a monocrystalline bulk silicon substrate, and the plurality of semiconductor fins 604/605 is a plurality of silicon fins. In accordance with one or more embodiments of the present disclosure, the fin structure including protruding fin portion 604 and sub-fin region 605 has a different semiconductor composition than substrate 602. In a particular embodiment, the substrate 602 is a monocrystalline bulk silicon substrate, and the plurality of semiconductor fins 604/605 is a plurality of silicon germanium or germanium fins. In another particular embodiment, the substrate 602 is a monocrystalline bulk silicon substrate, and the plurality of semiconductor fins 604/605 is a plurality of group III-V material fins.

Isolation region 606 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 606 is composed of a dielectric material such as, but not limited to, silicon dioxide, silicon oxy-nitride, silicon nitride, or carbon-doped silicon nitride.

Gate line 608 may be composed of a gate electrode stack which includes a gate dielectric layer 652 and a gate electrode layer 650. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 602. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 614 and overlying gate contact via 616 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 600 involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 608 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous NH$_4$OH or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 600. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 6A, the arrangement of semiconductor structure or device 600 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is used throughout the present description, lithographic operations are performed using 193 nm immersion lithography (i193), EUV and/or EBDW lithography, or the like. A positive tone or a negative tone resist may be used. In one embodiment, a trilayer mask composed of a topographic masking portion, an anti-reflective coating (ARC) layer, and a photoresist layer is used as a lithographic mask to provide a pattern of openings. In a particular such embodiment, the topographic masking portion is a carbon hardmask (CHM) layer and the anti-reflective coating layer is a silicon ARC layer.

In another aspect, it is to be appreciated that a fin depopulation (selective removal) process may be implemented for a plurality of fins prior to shaping individual fins in the approaches described above. In a fin depopulation or selective removal process fins may be removed during hardmask patterning or by physically removing the fin. The latter approach may be described as a "fin cut" process where one or more select fins are removed using an etch process. In one embodiment, the select fins are removed to a level that leaves a protruding portion (or stub) above the substantially planar bottom surface of the fins. In another embodiment, the select fins are removed to a level approximately co-planar with the substantially planar bottom surface of the fins. In another embodiment, the select fins are removed to a level that leaves a recess below the substantially planar surface of the bottom surface of the fins.

Figure 7A:
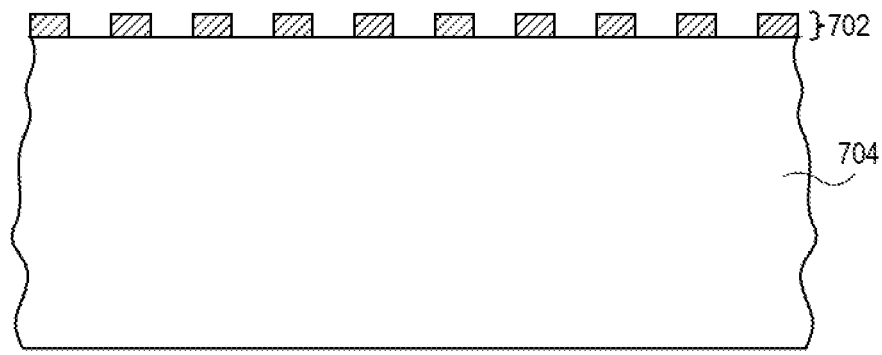
FIGS. 7A-7C cross-sectional views representing various operations in a method of fabricating a plurality of semiconductor fins, in accordance with an embodiment of the present disclosure.
Figure 7B:
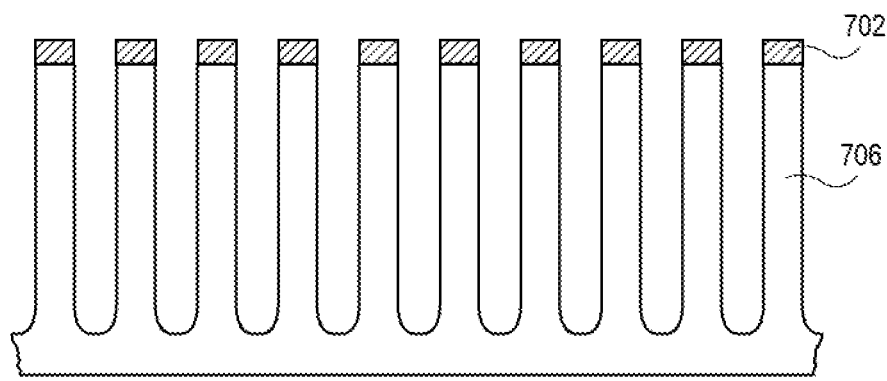
Figure 7C:
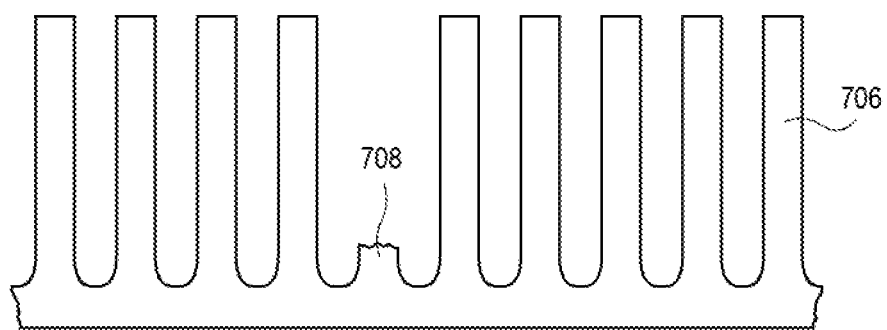

As an example of an approach based on physically removing the fin, FIGS. 7A-7C cross-sectional views representing various operations in a method of fabricating a plurality of semiconductor fins, in accordance with an embodiment of the present disclosure.

Referring to FIG. 7A, a patterned hardmask layer 702 is formed above a semiconductor layer 704, such as a bulk single crystalline silicon layer. Referring to FIG. 7B, fins 706 are then formed in the semiconductor layer 704, e.g., by a dry or plasma etch process. Referring to FIG. 7C, select fins 706 are removed, e.g., using a masking and etch process. In the example shown, one of the fins 706 is removed and may leave a remnant fin stub 708, as is depicted in FIG. 7C. In such a "fin removal last" approach, the hardmask 702 is patterned as whole to provide a grating structure without removal or modification of individual features. The fin population is not modified until after fins are fabricated.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Figure 8A:
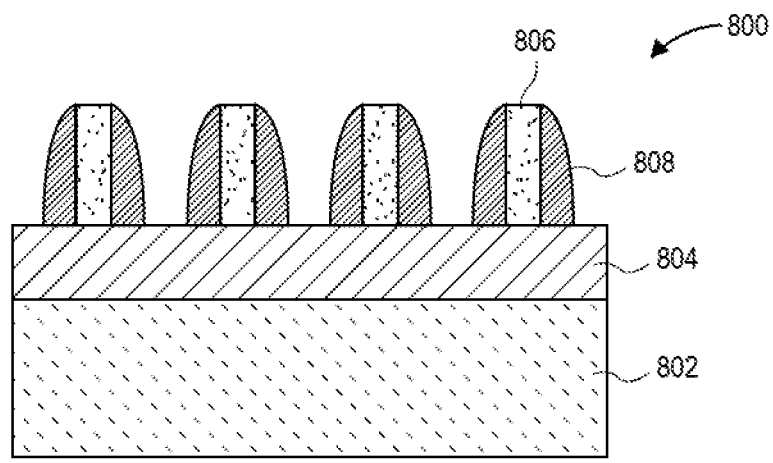
FIG. 8A illustrates a cross-sectional view of a starting structure following deposition, but prior to patterning, of a hardmask material layer formed on an interlayer dielectric (ILD) layer.
Figure 8B:
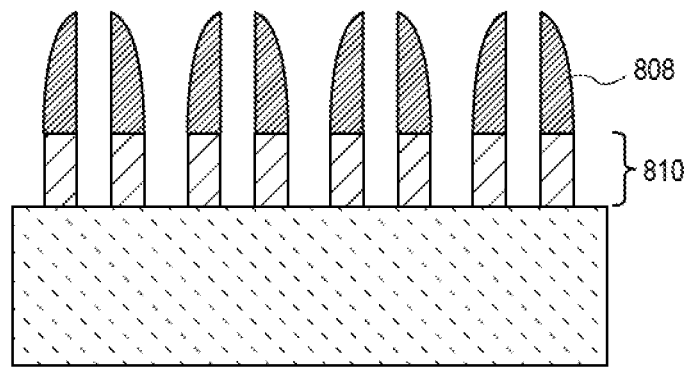
FIG. 8B illustrates a cross-sectional view of the structure of FIG. 8A following patterning of the hardmask layer by pitch halving.

In a first example, pitch halving can be implemented to double the line density of a fabricated grating structure. FIG. 8A illustrates a cross-sectional view of a starting structure following deposition, but prior to patterning, of a hardmask material layer formed on an interlayer dielectric (ILD) layer. FIG. 8B illustrates a cross-sectional view of the structure of FIG. 8A following patterning of the hardmask layer by pitch halving.

Referring to FIG. 8A, a starting structure 800 has a hardmask material layer 804 formed on an interlayer dielectric (ILD) layer 802. A patterned mask 806 is disposed above the hardmask material layer 804. The patterned mask 806 has spacers 808 formed along sidewalls of features (lines) thereof, on the hardmask material layer 804.

Referring to FIG. 8B, the hardmask material layer 804 is patterned in a pitch halving approach. Specifically, the patterned mask 806 is first removed. The resulting pattern of the spacers 808 has double the density, or half the pitch or the features of the mask 806. The pattern of the spacers 808 is transferred, e.g., by an etch process, to the hardmask material layer 804 to form a patterned hardmask 810, as is depicted in FIG. 8B. In one such embodiment, the patterned hardmask 810 is formed with a grating pattern having unidirectional lines. The grating pattern of the patterned hardmask 810 may be a tight pitch grating structure. For example, the tight pitch may not be achievable directly through selected lithography techniques. Even further, although not shown, the original pitch may be quartered by a second round of spacer mask patterning. Accordingly, the grating-like pattern of the patterned hardmask 810 of FIG. 8B may have hardmask lines spaced at a constant pitch and having a constant width relative to one another. The dimensions achieved may be far smaller than the critical dimension of the lithographic technique employed.

Accordingly, for either front-end of line (FEOL) or back-end of line (BEOL), or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

In accordance with one or more embodiments of the present disclosure, a pitch quartering approach is implemented for patterning a semiconductor layer to form semiconductor fins. In one or more embodiments, a merged fin pitch quartering approach is implemented.

Figure 9A:
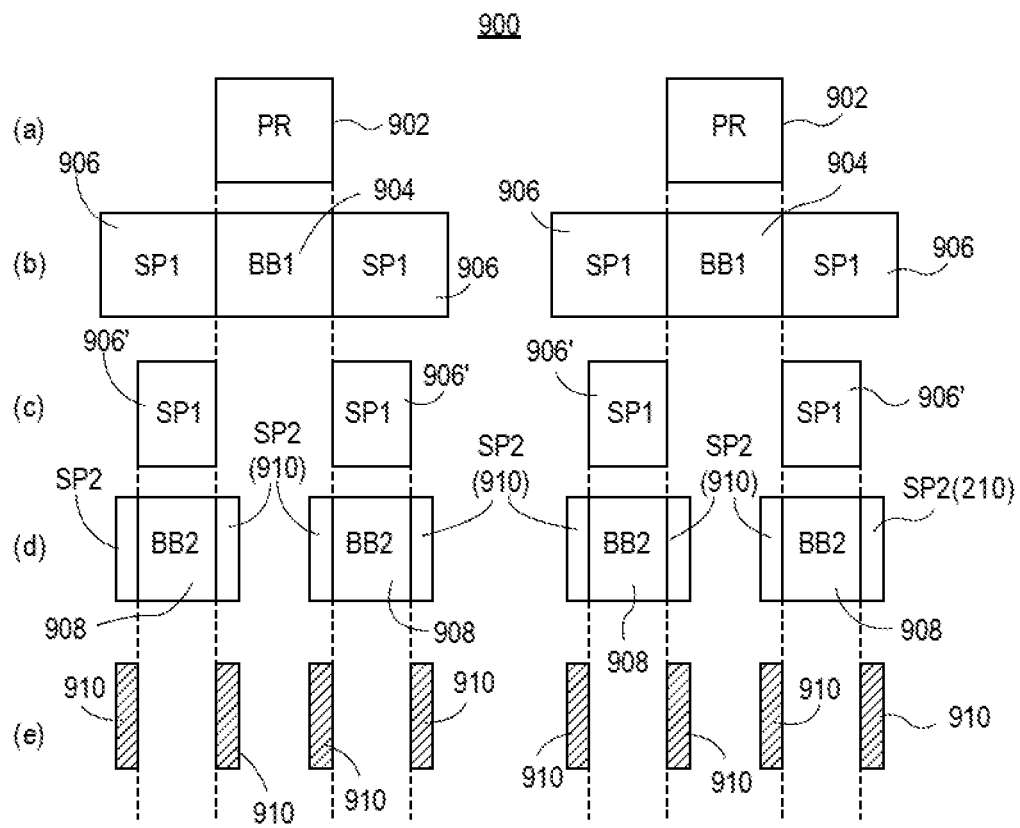
FIG. 9A is a schematic of a pitch quartering approach used to fabricate semiconductor fins, in accordance with an embodiment of the present disclosure.
Figure 9B:
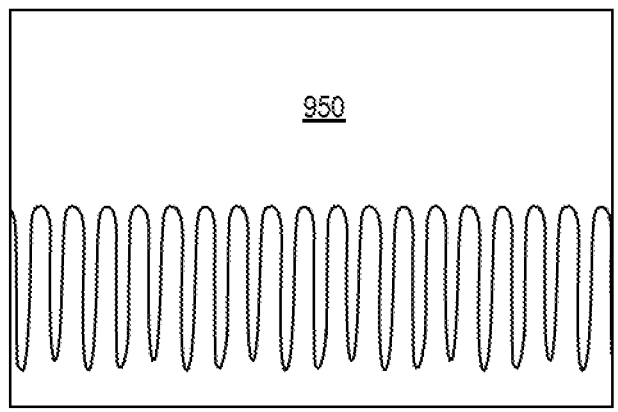
FIG. 9B illustrates a cross-sectional view of semiconductor fins fabricated using a pitch quartering approach, in accordance with an embodiment of the present disclosure.

FIG. 9A is a schematic of a pitch quartering approach 900 used to fabricate semiconductor fins, in accordance with an embodiment of the present disclosure. FIG. 9B illustrates a cross-sectional view of semiconductor fins fabricated using a pitch quartering approach, in accordance with an embodiment of the present disclosure.

Referring to FIG. 9A, at operation (a), a photoresist layer (PR) is patterned to form photoresist features 902. The photoresist features 902 may be patterned using standard lithographic processing techniques, such as 193 immersion lithography. At operation (b), the photoresist features 902 are used to pattern a material layer, such as an insulating or dielectric hardmask layer, to form first backbone (BB1) features 904. First spacer (SP1) features 906 are then formed adjacent the sidewalls of the first backbone features 904. At operation (c), the first backbone features 904 are removed to leave only the first spacer features 906 remaining. Prior to or during the removal of the first backbone features 904, the first spacer features 906 may be thinned to form thinned first spacer features 906', as is depicted in FIG. 9A. At operation (d), the first spacer features 906 or the thinned first spacer features 906' are used to pattern a material layer, such as an insulating or dielectric hardmask layer, to form second backbone (BB2) features 908. Second spacer (SP2) features 910 are then formed adjacent the sidewalls of the second backbone features 908. At operation (e), the second backbone features 908 are removed to leave only the second spacer features 910 remaining. The remaining second spacer features 910 may then be used to pattern a semiconductor layer to provide a plurality of semiconductor fins having a pitch quartered dimension relative to the initial patterned photoresist features 902. As an example, referring to FIG. 9B, a plurality of semiconductor fins 950, such as silicon fins formed from a bulk silicon layer, is formed using the second spacer features 910 as a mask for the patterning, e.g., a dry or plasma etch patterning. In the example of FIG. 9B, the plurality of semiconductor fins 950 has essentially a same pitch and spacing throughout.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
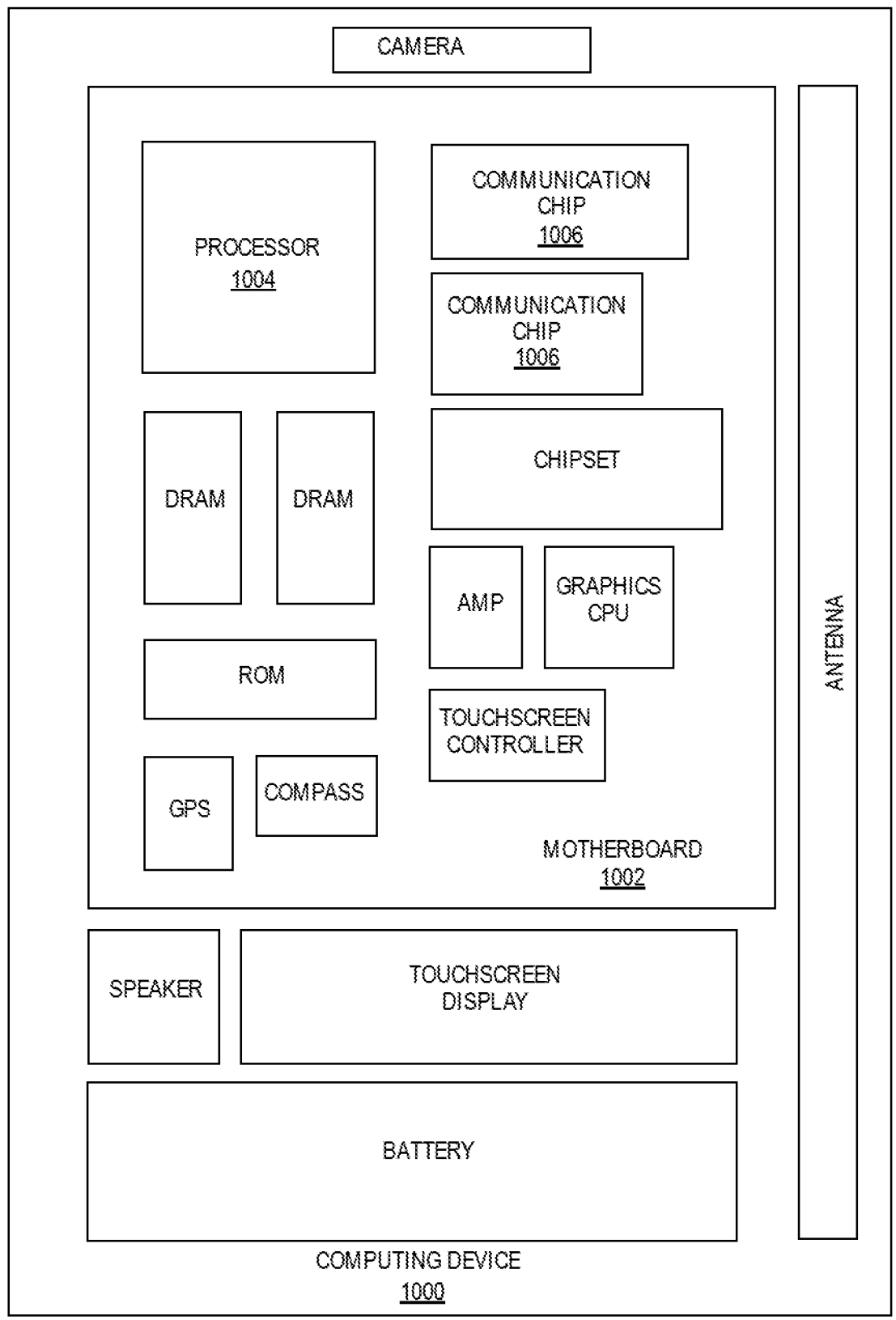
FIG. 10 illustrates a computing device in accordance with one implementation of an embodiment of the present disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of embodiments of the disclosure, the integrated circuit die of the processor 1004 includes one or more integrated circuit structures, such as semiconductor fins, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the disclosure, the integrated circuit die of the communication chip 1006 includes one or more integrated circuit structures, such as semiconductor fins, built in accordance with implementations of embodiments of the disclosure.

In further implementations, another component housed within the computing device 1000 may contain an integrated circuit die that includes one or more integrated circuit structures, such as semiconductor fins, built in accordance with implementations of embodiments of the disclosure.

In various embodiments, the computing device 1000 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
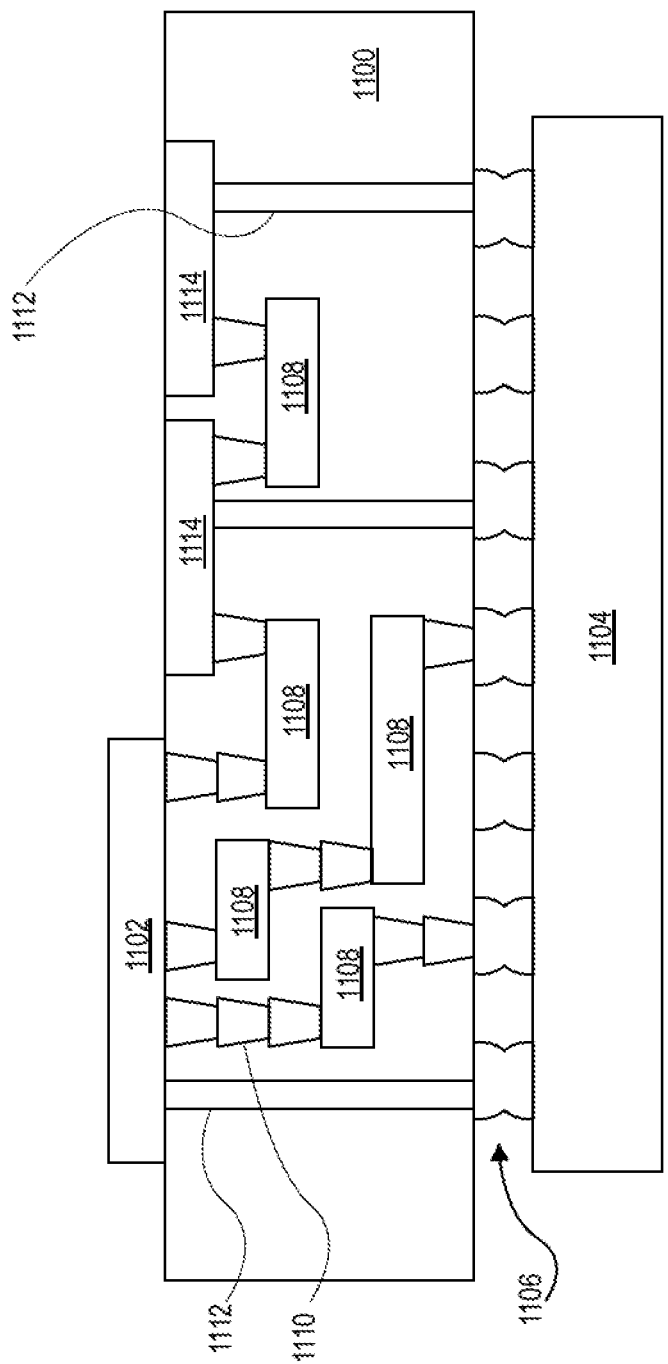
FIG. 11 illustrates an interposer that includes one or more embodiments of the present disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

In an embodiment, the first substrate 1102 is an integrated circuit die including one or more integrated circuit structures, such as semiconductor fins, built in accordance with double patterning implementations of embodiments of the disclosure. In an embodiment, the second substrate 1104 is a memory module, a computer motherboard, or another integrated circuit die including one or more integrated circuit structures, such as semiconductor fins, built in accordance with double patterning implementations of embodiments of the disclosure.

The interposer 1100 may be formed of an epoxy resin, a fiberglass-reinforced epoxy resin, a ceramic material, or a polymer material such as polyimide. In further implementations, the interposer 1100 may be formed of alternate rigid or flexible materials that may include the same materials described above for use in a semiconductor substrate, such as silicon, germanium, and other group III-V and group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100.

Figure 12:
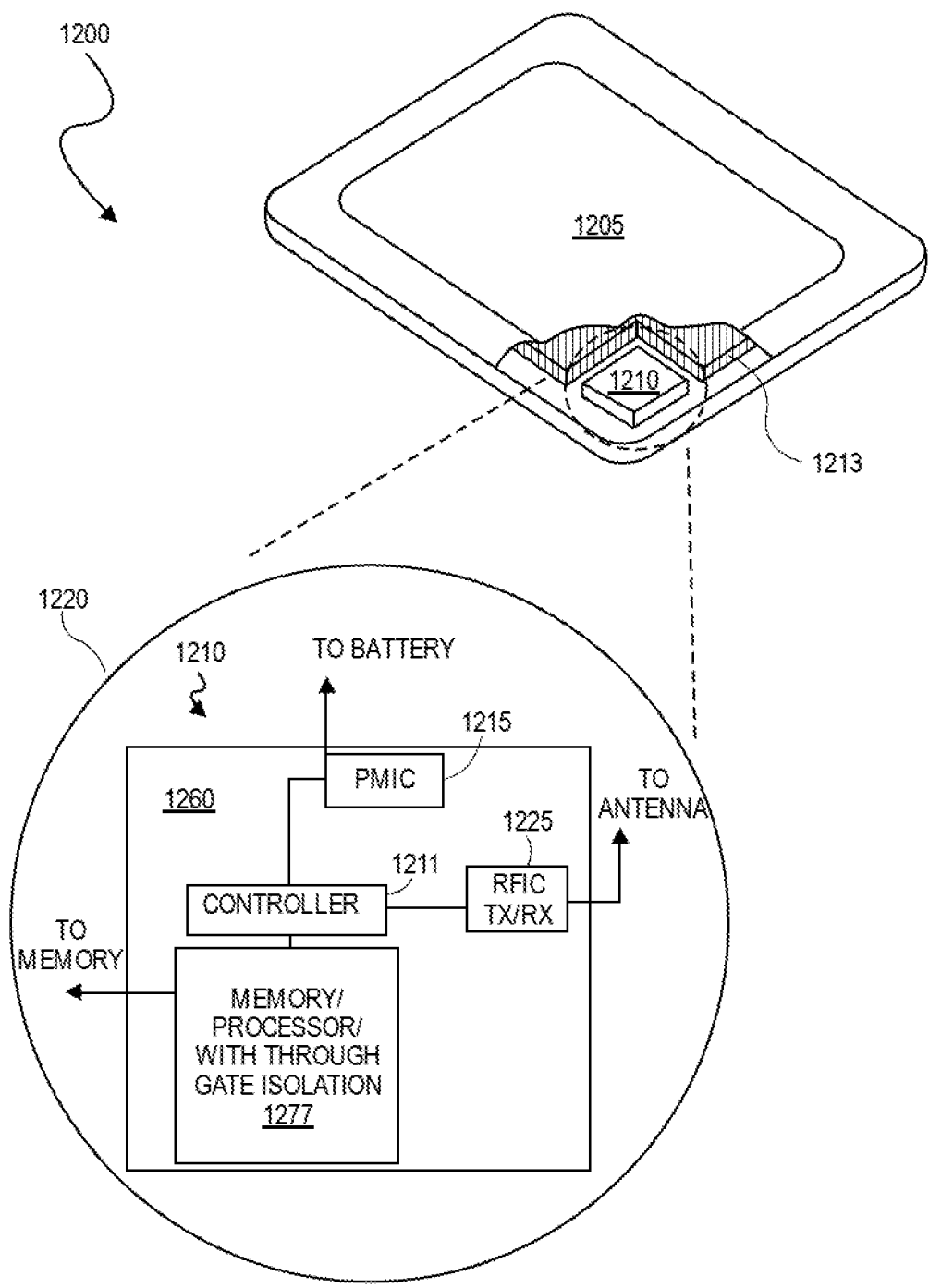
FIG. 12 is an isometric view of a mobile computing platform employing an IC fabricated according to one or more processes described herein or including one or more features described herein, in accordance with an embodiment of the present disclosure.

FIG. 12 is an isometric view of a mobile computing platform 1200 employing an integrated circuit (IC) fabricated according to one or more processes described herein or including one or more features described herein, in accordance with an embodiment of the present disclosure.

The mobile computing platform 1200 may be any portable device configured for each of electronic data display, electronic data processing, and wireless electronic data transmission. For example, mobile computing platform 1200 may be any of a tablet, a smart phone, laptop computer, etc. and includes a display screen 1205 which in the exemplary embodiment is a touchscreen (capacitive, inductive, resistive, etc.), a chip-level (SoC) or package-level integrated system 1210, and a battery 1213. As illustrated, the greater the level of integration in the integrated system 1210 enabled by higher transistor packing density, the greater the portion of the mobile computing platform 1200 that may be occupied by the battery 1213 or non-volatile storage, such as a solid state drive, or the greater the transistor gate count for improved platform functionality. Similarly, the greater the carrier mobility of each transistor in the integrated system 1210, the greater the functionality. As such, techniques described herein may enable performance and form factor improvements in the mobile computing platform 1200.

The integrated system 1210 is further illustrated in the expanded view 1220. In the exemplary embodiment, packaged device 1277 includes at least one memory chip (e.g., RAM), or at least one processor chip (e.g., a multi-core microprocessor and/or graphics processor) fabricated according to one or more processes described herein or including one or more features described herein. The packaged device 1277 is further coupled to the board 1260 along with one or more of a power management integrated circuit (PMIC) 1215, RF (wireless) integrated circuit (RFIC) 1225 including a wideband RF (wireless) transmitter and/or receiver (e.g., including a digital baseband and an analog front end module further includes a power amplifier on a transmit path and a low noise amplifier on a receive path), and a controller thereof 1211. Functionally, the PMIC 1215 performs battery power regulation, DC-to-DC conversion, etc., and so has an input coupled to the battery 1213 and with an output providing a current supply to all the other functional modules. As further illustrated, in the exemplary embodiment, the RFIC 1225 has an output coupled to an antenna to provide and implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1277 or within a single IC (SoC) coupled to the package substrate of the packaged device 1277.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 13:
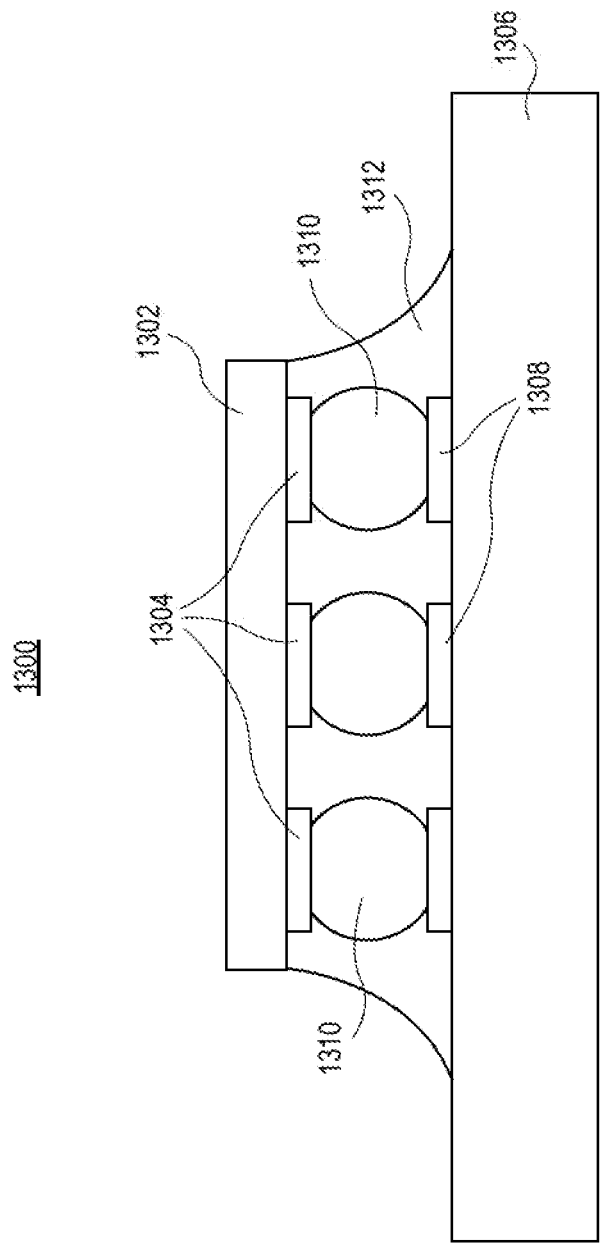
FIG. 13 illustrates a cross-sectional view of a flip-chip mounted die, in accordance with an embodiment of the present disclosure.

FIG. 13 illustrates a cross-sectional view of a flip-chip mounted die, in accordance with an embodiment of the present disclosure.

Referring to FIG. 13, an apparatus 1300 includes a die 1302 such as an integrated circuit (IC) fabricated according to one or more processes described herein or including one or more features described herein, in accordance with an embodiment of the present disclosure. The die 1302 includes metallized pads 1304 thereon. A package substrate 1306, such as a ceramic or organic substrate, includes connections 1308 thereon. The die 1302 and package substrate 1306 are electrically connected by solder balls 1310 coupled to the metallized pads 1304 and the connections 1308. An underfill material 1312 surrounds the solder balls 1310.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include fin shaping, and integrated circuit structures resulting therefrom.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a semiconductor fin having a protruding fin portion above an isolation structure above a substrate. The protruding fin portion has substantially vertical upper sidewalls and outwardly tapered lower sidewalls. A gate stack is over and conformal with the protruding fin portion of the semiconductor fin. A first source or drain region is at a first side of the gate stack, and a second source or drain region is at a second side of the gate stack opposite the first side of the gate stack.

Example Embodiment 2

The integrated circuit structure of example embodiment 1, wherein the semiconductor fin further includes a sub-fin portion on the substrate and within an opening in the isolation structure, the sub-fin portion continuous with the protruding portion.

Example Embodiment 3

The integrated circuit structure of example embodiment 2, wherein the sub-fin portion has a width greater than a width of the protruding portion where the sub-fin portion meets the protruding portion.

Example Embodiment 4

The integrated circuit structure of example embodiment 1, wherein the semiconductor fin is on a semiconductor layer on the substrate, the semiconductor fin including a semiconductor material different than the semiconductor layer.

Example Embodiment 5

The integrated circuit structure of example embodiment 1, 2, 3 or 4, wherein the substrate is a monocrystalline silicon substrate, and the semiconductor fin is a silicon fin.

Example Embodiment 6

The integrated circuit structure of example embodiment 1, 2, 3 or 4, wherein the substrate is a monocrystalline silicon substrate, and the semiconductor fin is a silicon germanium or germanium fin.

Example Embodiment 7

The integrated circuit structure of example embodiment 1, 2, 3 or 4, wherein the substrate is a monocrystalline silicon substrate, and the semiconductor fin is a group III-V material fin.

Example Embodiment 8

The integrated circuit structure of example embodiment 1, 2, 3, 4, 5, 6 or 7, wherein the first and second source or drain regions are embedded source or drain regions.

Example Embodiment 9

The integrated circuit structure of example embodiment 1, 2, 3, 4, 5, 6 or 7, wherein the first and second source or drain regions are formed in regions of the semiconductor fin at the first and second sides of the gate stack, respectively.

Example Embodiment 10

The integrated circuit structure of example embodiment 1, 2, 3, 4, 5, 6, 7, 8 or 9, wherein the gate stack includes a gate dielectric including a high-k dielectric material, and a gate electrode including a metal.

Example Embodiment 11

An integrated circuit structure includes a semiconductor fin having a protruding fin portion above an isolation structure above a substrate. The protruding fin portion has substantially vertical upper sidewalls and inwardly tapered lower sidewalls. The semiconductor fin further includes a sub-fin portion on the substrate and within an opening in the isolation structure, the sub-fin portion continuous with the protruding portion. The sub-fin portion has a width greater than a width of the protruding portion where the sub-fin portion meets the protruding portion. A gate stack is over and conformal with the protruding fin portion of the semiconductor fin. A first source or drain region is at a first side of the gate stack, and a second source or drain region at a second side of the gate stack opposite the first side of the gate stack.

Example Embodiment 12

The integrated circuit structure of example embodiment 11, wherein the substrate is a monocrystalline silicon substrate, and the semiconductor fin is a silicon fin.

Example Embodiment 13

The integrated circuit structure of example embodiment 11, wherein the substrate is a monocrystalline silicon substrate, and the semiconductor fin is a silicon germanium or germanium fin.

Example Embodiment 14

The integrated circuit structure of example embodiment 11, wherein the substrate is a monocrystalline silicon substrate, and the semiconductor fin is a group III-V material fin.

Example Embodiment 15

The integrated circuit structure of example embodiment 11, 12, 13 or 14, wherein the first and second source or drain regions are embedded source or drain regions.

Example Embodiment 16

The integrated circuit structure of example embodiment 11, 12, 13 or 14, wherein the first and second source or drain regions are formed in regions of the semiconductor fin at the first and second sides of the gate stack, respectively.

Example Embodiment 17

The integrated circuit structure of example embodiment 11, 12, 13, 14, 15 or 16, wherein the gate stack includes a gate dielectric including a high-k dielectric material, and a gate electrode including a metal.

Example Embodiment 18

An integrated circuit structure includes a semiconductor fin having a protruding fin portion above an isolation structure above a substrate. The protruding fin portion has substantially vertical upper sidewalls and substantially vertical lower sidewalls. The semiconductor fin further includes a sub-fin portion on the substrate and within an opening in the isolation structure, the sub-fin portion continuous with the protruding portion. The sub-fin portion has a width greater than a width of the protruding portion where the sub-fin portion meets the protruding portion. A gate stack is over and conformal with the protruding fin portion of the semiconductor fin. A first source or drain region is at a first side of the gate stack, and a second source or drain region at a second side of the gate stack opposite the first side of the gate stack.

Example Embodiment 19

The integrated circuit structure of example embodiment 18, wherein the substrate is a monocrystalline silicon substrate, and the semiconductor fin is a silicon fin.

Example Embodiment 20

The integrated circuit structure of example embodiment 18, wherein the substrate is a monocrystalline silicon substrate, and the semiconductor fin is a silicon germanium or germanium fin.

Example Embodiment 21

The integrated circuit structure of example embodiment 18, wherein the substrate is a monocrystalline silicon substrate, and the semiconductor fin is a group III-V material fin.

Example Embodiment 22

The integrated circuit structure of example embodiment 18, 19, 20 or 21, wherein the first and second source or drain regions are embedded source or drain regions.

Example Embodiment 23

The integrated circuit structure of example embodiment 18, 19, 20 or 21, wherein the first and second source or drain regions are formed in regions of the semiconductor fin at the first and second sides of the gate stack, respectively.

Example Embodiment 24

The integrated circuit structure of example embodiment 18, 19, 20, 21, 22 or 23, wherein the gate stack includes a gate dielectric including a high-k dielectric material, and a gate electrode including a metal.

What is claimed is:
1. An integrated circuit structure, comprising:
a semiconductor fin having a protruding fin portion above an isolation structure above a substrate, the protruding fin portion having substantially vertical upper sidewalls and outwardly tapered lower sidewalls, and the semiconductor fin further comprising a sub-fin portion on the substrate and within an opening in the isolation structure, the sub-fin portion in contact with the protruding portion, and the sub-fin portion having an upper horizontal surface extending laterally beyond the protruding fin portion;
a gate stack over and conformal with the protruding fin portion of the semiconductor fin;
a first source or drain region at a first side of the gate stack; and
a second source or drain region at a second side of the gate stack opposite the first side of the gate stack.
2. The integrated circuit structure of claim 1, wherein the sub-fin portion has a width greater than a width of the protruding portion where the sub-fin portion meets the protruding portion.
3. The integrated circuit structure of claim 1, wherein the semiconductor fin is on a semiconductor layer on the substrate, the semiconductor fin comprising a semiconductor material different than the semiconductor layer.

4. The integrated circuit structure of claim 1, wherein the substrate is a monocrystalline silicon substrate, and the semiconductor fin is a silicon fin.

5. The integrated circuit structure of claim 1, wherein the substrate is a monocrystalline silicon substrate, and the semiconductor fin is a silicon germanium or germanium fin.

6. The integrated circuit structure of claim 1, wherein the substrate is a monocrystalline silicon substrate, and the semiconductor fin is a group III-V material fin.

7. The integrated circuit structure of claim 1, wherein the first and second source or drain regions are embedded source or drain regions.

8. The integrated circuit structure of claim 1, wherein the first and second source or drain regions are formed in regions of the semiconductor fin at the first and second sides of the gate stack, respectively.

9. The integrated circuit structure of claim 1, wherein the gate stack comprises a gate dielectric comprising a high-k dielectric material, and a gate electrode comprising a metal.

10. An integrated circuit structure, comprising:
   a semiconductor fin having a protruding fin portion above an isolation structure above a substrate, the protruding fin portion having substantially vertical upper sidewalls and inwardly tapered lower sidewalls, and the protruding fin portion comprising a same semiconductor material from a bottom of the protruding fin portion to a top of the protruding fin portion, and the semiconductor fin further comprises a sub-fin portion on the substrate and within an opening in the isolation structure, the sub-fin portion continuous with the protruding portion, wherein the sub-fin portion has a width greater than a width of the protruding portion where the sub-fin portion meets the protruding portion;
   a gate stack over and conformal with the protruding fin portion of the semiconductor fin;
   a first source or drain region at a first side of the gate stack; and
   a second source or drain region at a second side of the gate stack opposite the first side of the gate stack.

11. The integrated circuit structure of claim 10, wherein the substrate is a monocrystalline silicon substrate, and the semiconductor fin is a silicon fin.

12. The integrated circuit structure of claim 10, wherein the substrate is a monocrystalline silicon substrate, and the semiconductor fin is a silicon germanium or germanium fin.

13. The integrated circuit structure of claim 10, wherein the substrate is a monocrystalline silicon substrate, and the semiconductor fin is a group III-V material fin.

14. The integrated circuit structure of claim 10, wherein the first and second source or drain regions are embedded source or drain regions.

15. The integrated circuit structure of claim 10, wherein the first and second source or drain regions are formed in regions of the semiconductor fin at the first and second sides of the gate stack, respectively.

16. The integrated circuit structure of claim 10, wherein the gate stack comprises a gate dielectric comprising a high-k dielectric material, and a gate electrode comprising a metal.

17. An integrated circuit structure, comprising:
   a semiconductor fin having a protruding fin portion above an isolation structure above a substrate, the protruding fin portion having substantially vertical upper sidewalls and substantially vertical lower sidewalls, and the semiconductor fin further comprises a sub-fin portion on the substrate and within an opening in the isolation structure, the sub-fin portion continuous with the protruding fin portion, wherein the sub-fin portion has a width greater than a width of the protruding fin portion where the sub-fin portion meets the protruding fin portion, and the sub-fin portion has an upper horizontal surface extending laterally beyond the protruding fin portion;
   a gate stack over and conformal with the protruding fin portion of the semiconductor fin;
   a first source or drain region at a first side of the gate stack; and
   a second source or drain region at a second side of the gate stack opposite the first side of the gate stack.

18. The integrated circuit structure of claim 17, wherein the substrate is a monocrystalline silicon substrate, and the semiconductor fin is a silicon fin.

19. The integrated circuit structure of claim 17, wherein the substrate is a monocrystalline silicon substrate, and the semiconductor fin is a silicon germanium or germanium fin.

20. The integrated circuit structure of claim 17, wherein the substrate is a monocrystalline silicon substrate, and the semiconductor fin is a group III-V material fin.

21. The integrated circuit structure of claim 17, wherein the first and second source or drain regions are embedded source or drain regions.

22. The integrated circuit structure of claim 17, wherein the first and second source or drain regions are formed in regions of the semiconductor fin at the first and second sides of the gate stack, respectively.

23. The integrated circuit structure of claim 17, wherein the gate stack comprises a gate dielectric comprising a high-k dielectric material, and a gate electrode comprising a metal.

* * * * *